United States Patent
Gattuso et al.

(10) Patent No.: US 6,716,049 B1
(45) Date of Patent: Apr. 6, 2004

(54) IC SOCKET WITH BEARING SPRINGS

(75) Inventors: Andrew Gattuso, Phoenix, AZ (US); Sung-Pei Hou, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/425,084

(22) Filed: Apr. 28, 2003

(51) Int. Cl.[7] .............................................. H01R 13/62
(52) U.S. Cl. ........................ 439/331; 439/73; 439/526; 439/342
(58) Field of Search ........................... 439/331, 71, 73, 439/72, 70, 330, 525, 526, 248, 264, 266, 342

(56) References Cited

U.S. PATENT DOCUMENTS

| | | | | |
|---|---|---|---|---|
| 3,391,383 A | * | 7/1968 | Antes | 439/331 |
| 4,758,176 A | * | 7/1988 | Abe et al. | 439/331 |
| 4,969,828 A | * | 11/1990 | Bright et al. | 439/68 |
| 5,100,332 A | | 3/1992 | Egawa | |
| 5,460,538 A | * | 10/1995 | Ikeya | 439/331 |
| 5,609,497 A | * | 3/1997 | Kawabe | 439/331 |
| 5,807,104 A | * | 9/1998 | Ikeya et al. | 439/73 |
| 6,142,809 A | * | 11/2000 | Fukunaga | 439/331 |
| 6,575,767 B2 | * | 6/2003 | Satoh et al. | 439/71 |

* cited by examiner

*Primary Examiner*—Gary V. Pauman
*Assistant Examiner*—Edwin A. Leon
(74) *Attorney, Agent, or Firm*—Wei Te Chung

(57) ABSTRACT

An IC socket (1) includes a base (10), a cover (11) pivotally mounted to one side of the base, and a plurality of electrical contacts received in the base for electrically connecting with a burn-in board. The base has six projecting members (102) to form a container for receiving an IC therein. The cover includes a frame (110) defining an opening (1101) a middle thereof, and a pressing portion (111). The pressing portion comprises a pair of bearing springs (1110), and a pair of bars (1111) interconnecting corresponding opposite ends of the bearing springs. The bars are embedded in the rear and front sides of the frame, and the bearing springs are located in opposite lateral sides of the opening. When the cover firmly engaging with the base, the bearing springs press the IC on the contacts. The IC socket thus electrically connects the IC with the burn-in board.

1 Claim, 4 Drawing Sheets

IC SOCKET WITH BEARING SPRINGS

BACKGROUND OF THE INVENTION

1. Field of the Invention

The present invention relates to an IC socket for electrically connecting an electronic package such as an integrated circuit (IC) with a circuit substrate such as a burn-in board.

2. Description of the Prior Art

Electronic packages, such as integrated circuits (ICs), are miniaturized electronic devices in which a number of active and passive circuit elements are located on or within a continuous body of material to perform the function of a complete circuit. To ensure reliability in use, the ICs require prior burning in to test their durability. The ICs are operated at high temperature for an extended period of time to accelerate potential failure points. This helps eliminate early product failures once the ICs are sold and/or assembled onto electronic end products. An IC socket is used to receive an IC therein, and to electrically connect the IC with a burn-in board for operation of the IC at high temperature.

Conventional IC sockets are disclosed in U.S. Pat. Nos. 5,609,497 and 5,100,332. This typical kind of IC socket comprises a base, a cover pivotally mounted to one side of the base, and a plurality of electrical contacts received in the base. The base comprises a loading table at a middle thereof for loading an IC thereon, and a lip on an end thereof. The contacts are mounted around the loading table. Each contact comprises a flexible contact portion exposed outwardly from a top of the base, and a tail exposed outwardly from a bottom of the base. Therefore, the tail is liable to be accidentally damaged, particularly during shipping of the IC socket. The cover comprises a frame pivotally mounted on the base, and a hook movably mounted on an end of the frame. The hook comprises a clasp on an end thereof, for snappingly engaging with the lip of the base. The frame defines a generally rectangular cavity, and has four pressing members around a periphery of the cavity.

In use, the tails of the contacts are electrically connected with a burn-in board. The cover is oriented perpendicularly to the base. The IC is attached on the loading table of the base, with leads of the IC loosely attached on the contact portions of the corresponding contacts. Then, the cover is rotated downwardly to a horizontal position, and the clasp of the hook clasps a bottom of the lip. The IC is accommodated within the cavity of the cover, with the pressing members of the frame firmly pressing the leads on the contact portions of the contacts. The IC socket thus electrically connects the IC with the burn-in board. The whole assembly is operated at high temperature for an extended period of time to accelerate potential failure points, thereby ascertaining the IC's likely operational reliability.

In general, the base and the cover are made of rigid material, and have restricted dimensional tolerances respectively. These dimensional tolerances are cumulative in the assembled IC socket. When the IC socket's cumulative dimensional error is greater than a maximum allowable tolerance, the pressing members of the cover are unable to tightly press the leads of the IC on the contacts. When this happens, the IC may not be stably electrically connected with the burning-in board. When the cumulative dimensional error is less than a minimum allowable tolerance, the clasp of the cover is unable to clasp the lip of the base, and the cover cannot firmly engage with the base. Therefore, the base and the cover must be accurately made, which increases the difficulty and cost of manufacturing. In addition, the pressing members of the cover directly press on the leads of the IC, and are liable to damage the leads of the IC.

In view of the above, a new IC socket that overcomes the above-mentioned disadvantages is desired.

SUMMARY OF THE INVENTION

Accordingly, an object of the present invention is to provide an integrated circuit (IC) socket for reliably electrically connecting an electronic package such as an IC with a circuit substrate such as a burn-in board, even if the IC has dimensional error.

Another object of the present invention is to provide an integrated circuit (IC) socket which can be safely shipped, and which can be manufactured at low cost.

To achieve the above-mentioned objects, an integrated circuit (IC) socket in accordance with a preferred embodiment of the present invention comprises a base, a cover pivotally mounted to one side of the base, and a plurality of electrical contacts received in the base for electrically connecting with a burn-in board. The base defines a multiplicity of passageways in a middle portion thereof, and has a securing member at an end thereof. Six projecting members are formed around a periphery of an array of the passageways to form a container for receiving an IC therein. The cover comprises a frame defining an opening in a middle thereof, a hook pivotally mounted to a front side of the frame, and a pressing portion insert-molded into the frame. The pressing portion comprises a pair of bearing springs, and a pair of bars interconnecting corresponding opposite ends of the bearing springs. The bars are embedded in the rear and front sides of the frame, and the bearing springs are located in opposite lateral sides of the opening. When the hook of the cover firmly engaging with the securing member of the base, the bearing springs press a top surface of the IC to electrically connect the IC with the contacts. The IC socket thus electrically connects the IC with the burn-in board.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
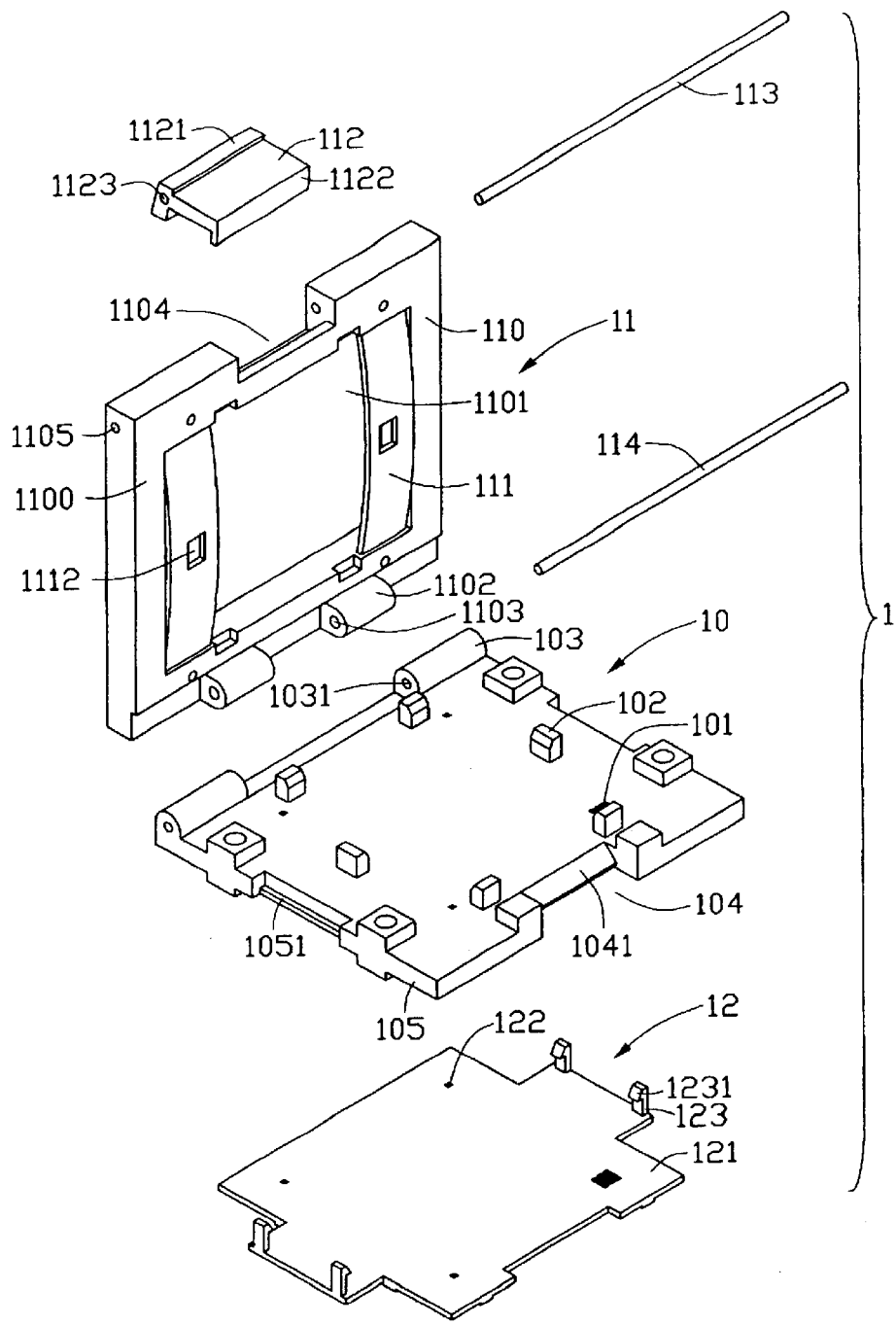
FIG. 1 is a simplified, exploded isometric view of an IC socket of the present invention.

Referring to FIG. 1, an integrated circuit (IC) socket 1 is adapted for electrically connecting an electronic package such as an integrated circuit (IC) (not shown) with a circuit substrate such as a burn-in board (not shown).

The IC socket 1 comprises a base 10, a cover 11 pivotally mounted to one side of the base 10, a plurality of electrical contacts (not shown) received in the base 10, and a solder barrier 12 mounted on a bottom of the base 10.

The base 10 comprises a multiplicity of passageways 101 extending through a middle portion thereof. The passageways 101 are arranged in a rectangular array for respectively receiving a corresponding number of the contacts therein. Six projecting members 102 are formed around a periphery of the array of the passageways 101. Each projecting member 102 is confronted by another opposite projecting member 102, such that all the projecting members 102 cooperatively form a rectangular container for receiving the IC therein. Also, the base 10 comprises a pair of spaced hinge blocks 103 on a rear side thereof, a recess 104 defined in an opposite front side thereof, and a pair of lateral sidewalls 105. Each hinge block 103 defines a hole 1031 therethrough. A securing member, such as a triangular lip 1041, is formed in the base 10 at the recess 104. The lip 1041 comprises a bottom engaging surface. Each sidewall 105 forms a step 1051 along a middle portion thereof.

Figure 2:
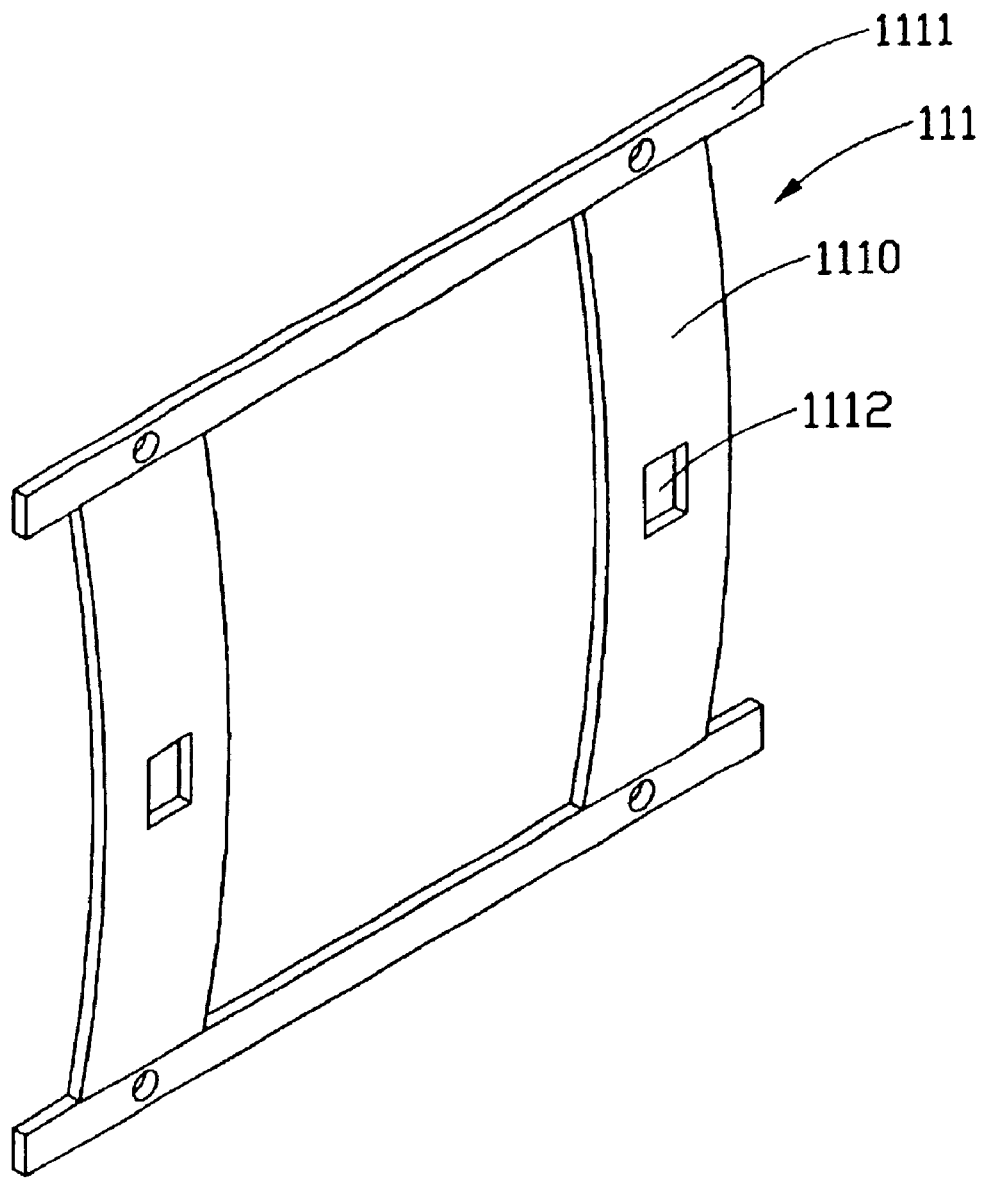
FIG. 2 is an isometric view of a pressing portion of the IC socket of FIG. 1.
Figure 3:
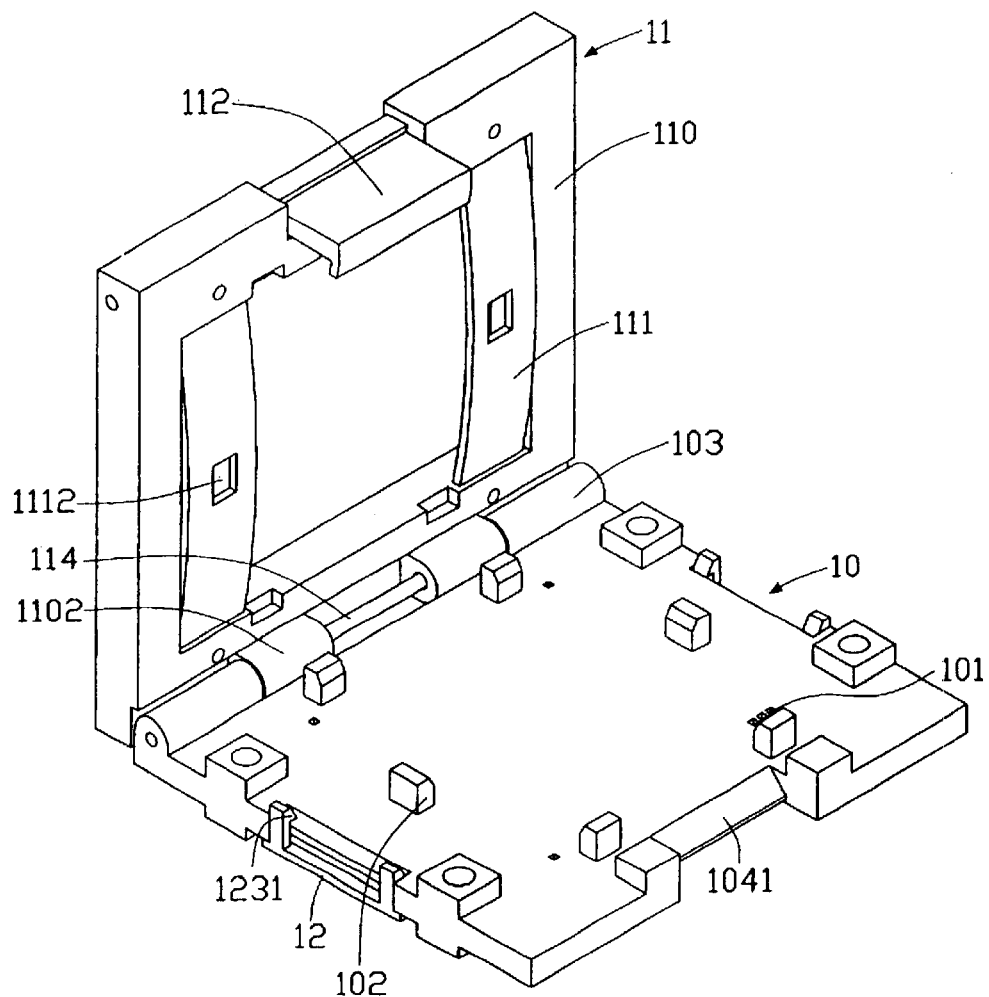
FIG. 3 is an assembled view of FIG. 1, showing a cover of the IC socket in an open position.

Also referring to FIGS. 2 and 3, the cover 11 comprises a generally rectangular frame 110, a hook 112 pivotally mounted on a front side of the frame 110, and a generally rectangular pressing portion 111 insert-molded into the frame 110. The frame 110 comprises four beams 1100 that cooperatively define an opening 1101 therebetween. A rear one of the beams 1100 forms a pair of spaced hinge blocks 1102 at a middle portion thereof. Each hinge block 1102 defines a hole 1103 therethrough. An opposite front beam 1100 defines a socket 1104 in a middle portion thereof, and a pair of aligned holes 1105 on respective opposite sides of and in communication with the socket 1104. The hook 112 comprises an acting member 1121, and a locking member 1122 extending perpendicularly from a bottom of the acting member 1121. The acting member 1121 has a trapezi form cross-section, and defines a hole 1123 therethrough. A pin 113 is received through the holes 1105 of the frame 110 and the hole 1123 of the hook 112, thereby pivotally mounting the hook 112 in the socket 1104 of the frame 110. The pressing portion 111 comprises a pair of arcuate bearing springs 1110, and a pair of bars 1111 interconnecting corresponding opposite ends of the bearing springs 1110. Each bearing spring 1110 defines an aperture 1112 in a middle portion thereof. The bearing springs 1110 are parallel to each other, and spaced apart a distance. The bars 1111 are respectively embedded in the front and rear beams 1100 of the cover 11, and the bearing springs 1110 are located in opposite lateral sides of the opening 1101 of the frame 111. A pin 114 is received through the holes 1031 of the base 10 and the holes 1103 of the hinge blocks 1102 of the cover 11, thereby pivotally mounting the cover 11 on the base 10.

The contacts are respectively received in the passageways 101 of the base 10. Each contact comprises a solder portion protruding out from a bottom of the base 10, and a contact portion protruding out from a top of the base. The solder portion is adapted for electrically connecting with the burn-in board. The contact portion is adapted for electrically contacting a corresponding metal pad on a bottom surface of the IC.

The solder barrier 12 comprises a planar body 121. A multiplicity of bores 122 is defined in a middle portion of the planar body 121. A pair of clasps 123 is formed at each of two opposite lateral sides of the planar body 121. Each clasp 123 extends perpendicularly from a corresponding edge of the planar body 121, and comprising a claw 1231 at a free end thereof. The claw 1231 snappingly engages with a corresponding step 1051 of the base 10, with the clasp 123 undergoing the elastic deformation. The claws 1231 thereby mount the solder barrier 12 to the bottom of the base 10. The bores 122 are respectively located under corresponding passageways 101 of the base 10.

Figure 5:
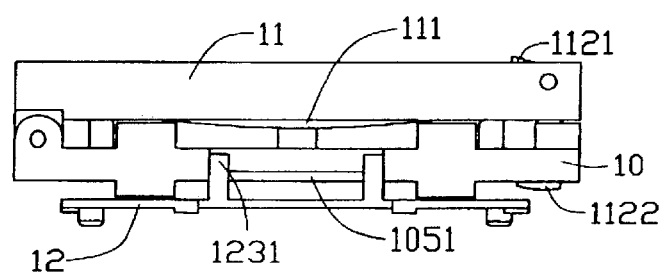
FIG. 5 is a left side elevation view of FIG. 4, but showing a solder barrier mounted on a bottom of a base of the IC socket in a lower protective position for shipping of the IC socket.

Referring also to FIG. 5, because the claws 1231 of the solder barrier 12 resiliently clasp the steps 1051 of the base 10, a space is defined between the bottom of the base 10 and a top of the planar body 121. The parts of the solder portions of the contacts that protrude from the bottom of the base 10 are accommodated within the space. This protects the solder portions against accidental damage, particularly during shipping of the IC socket 1.

Figure 4:
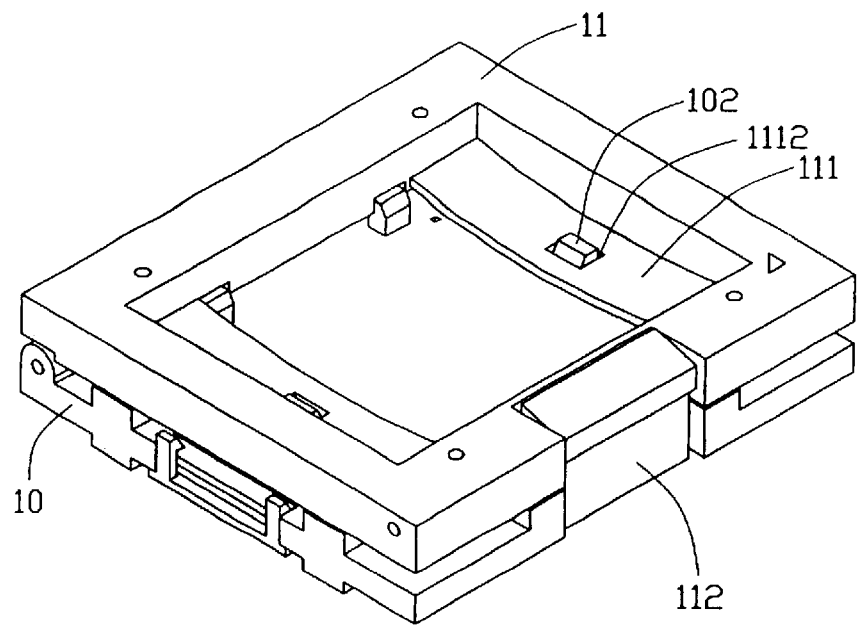
FIG. 4 is similar to FIG. 3, but showing the cover in a closed position.

Referring also to FIG. 4, in use, the solder barrier 12 is pressed upwardly to abut the bottom of the base 10. The solder portions of the contacts thereby respectively pass through corresponding bores 122 of the solder barrier 12 to be exposed therebelow. In this position, the solder portions of the contacts can be electrically connected with the burn-in board by welding. Then, the cover 11 is rotated upwardly to be oriented perpendicularly to the base 10. The IC is mounted into the container of the base 10. Then, the cover 11 is rotated downwardly to a horizontal position. The locking member 1122 of the hook 112 snappingly engages with the engaging surface of the lip 1041. In this position, the acting member 1121 of the hook 112 projects from a top of the frame 110 of the cover 11 (see FIGS. 4 and 5). Simultaneously, two of the projecting members 102 are received through the apertures 1112 of the bearing springs 1110, and the bearing springs 1110 press a top surface of the IC. Accordingly the metal pads of the IC firmly electrically connect with the contact portions of the contacts. The IC socket thus electrically connects the IC with the burn-in board. Thence, the whole assembly can be operated at high temperature for an extended period of time to accelerate potential failure points.

After the burn-in, the acting member 1121 of the hook 112 is pressed downwardly, and the locking member 1122 of the hook 112 is rotated outwardly so that it is unlocked from the lip 1041 of the base 10. The cover 11 is rotated upwardly to be oriented perpendicularly to the base 10. The IC can be easily taken out from the base 10, and a new IC can be mounted in the base 10 to be electrically connected with the burn-in board.

The bearing springs 1110 are able to deform elastically, thereby enabling the IC to be firmly mounted on the base 10 even if the IC has dimensional error. Furthermore, the configuration of the IC socket 1 is relatively simple, thereby enabling it to be mass-produced at low cost.

In the above-described IC socket 1, the pressing portion 111 is embedded into the frame 110 of the cover 11. It should be understood that alternative means of combining the pressing portion 111 with the frame 110 may be adopted. For example, the pressing portion 111 can be mounted on the frame 110 with screws. Other alternative combining means may be adopted, according to the particular configurations of the frame 110 and the pressing portion 111 selected.

Moreover, although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. An integrated circuit (IC) socket, comprising:
   a base defining a multiplicity of passageways in a middle portion thereof, and having a securing member at one side thereof;

a plurality of contacts respectively received in the passageways of the base;

a cover moveably mounted on an opposite side of the base, the cover comprising a frame defining an opening, a pressing portion mounted on the frame and a hook mounted at one side thereof, the hook comprising a locking member for engaging with the securing member of the base, the pressing portion comprising at least one elastic bearing spring there are two bearing springs located in opposite lateral sides of the opening of the frame, the pressing portion further comprises a pair of bars respectively interconnecting two opposite ends of the bearing springs, and being embedded within the rear and front sides of the frame, the base comprises six projecting members defining a rectangular container for receiving an IC therein, each bearing spring defines an aperture in a middle for receiving one projecting member therein, the hook further comprises an acting member having a trapeziform cross-section, and projecting from a top of the cover when the locking member engages firmly with the securing member of the base, the base comprises a pair of lateral sidewalls each forming a step along a middle portion thereof, a solder barrier mounted on a bottom of the base, the solder barrier comprises a planar body defining a multiplicity of bores in a middle portion thereof, and two pairs of clasps formed at each of two opposite lateral sides of the planar body for engaging with the steps of the base and wherein each clasp extends perpendicularly from a corresponding edge of the planar body, and comprises a claw at a free end thereof engaging one of the steps of the base.

* * * * *